US008917551B2

(12) United States Patent
Lee et al.

(10) Patent No.: US 8,917,551 B2
(45) Date of Patent: Dec. 23, 2014

(54) FLEXIBLE 2T-BASED FUZZY AND CERTAIN MATCHING ARRAYS

(75) Inventors: Peter Wung Lee, Saratoga, CA (US); Fu-Chang Hsu, San Jose, CA (US)

(73) Assignee: Aplus Flash Technology, Inc., Fremont, CA (US)

( * ) Notice: Subject to any disclaimer, the term of this patent is extended or adjusted under 35 U.S.C. 154(b) by 87 days.

(21) Appl. No.: 13/347,913

(22) Filed: Jan. 11, 2012

(65) Prior Publication Data

US 2012/0176841 A1 Jul. 12, 2012

Related U.S. Application Data

(60) Provisional application No. 61/461,044, filed on Jan. 11, 2011.

(51) Int. Cl.
*G11C 11/34* (2006.01)
*G11C 16/04* (2006.01)
*G11C 16/10* (2006.01)

(52) U.S. Cl.
CPC ........ *G11C 16/0483* (2013.01); *G11C 16/0441* (2013.01); *G11C 16/10* (2013.01)
USPC ............ 365/185.17; 365/185.18; 365/185.05; 365/185.03

(58) Field of Classification Search
USPC .............. 365/185.17, 185.18, 185.05, 185.03
See application file for complete search history.

(56) References Cited

U.S. PATENT DOCUMENTS

| | | | | |
|---|---|---|---|---|
| 5,687,118 A | * | 11/1997 | Chang ...................... | 365/185.19 |
| 5,801,994 A | * | 9/1998 | Chang et al. ............. | 365/185.29 |
| 5,862,082 A | * | 1/1999 | Dejenfelt et al. ......... | 365/185.33 |
| 6,781,881 B2 | * | 8/2004 | Chih ......................... | 365/185.18 |
| 6,980,472 B2 | * | 12/2005 | Ditewig et al. .......... | 365/185.18 |
| 7,154,783 B2 | * | 12/2006 | Lee et al. .................. | 365/185.11 |
| 7,471,570 B2 | * | 12/2008 | Morton et al. ........... | 365/185.28 |
| 7,652,909 B2 | * | 1/2010 | Du ................................. | 365/145 |
| 7,706,180 B2 | * | 4/2010 | Jenne ........................ | 365/185.02 |
| 8,072,811 B2 | | 12/2011 | Lee et al. | |
| 8,149,622 B2 | * | 4/2012 | Lee et al. .................. | 365/185.18 |
| 8,295,087 B2 | * | 10/2012 | Lee et al. .................. | 365/185.17 |
| 8,355,287 B2 | * | 1/2013 | Hsu et al. .................. | 365/185.22 |
| 2010/0265766 A1 | * | 10/2010 | Lue ........................... | 365/185.03 |

* cited by examiner

*Primary Examiner* — Viet Q Nguyen
(74) *Attorney, Agent, or Firm* — Saile Ackerman LLC; Stephen B. Ackerman (57) ABSTRACT

A novel NVM-based 2T or 2nT NAND-cell for a NAND-array for PLD, PAL and matching functions is disclosed. The preferable NVM cell can be ROM or Flash. The 2T flash cell preferably uses FN for both program and erase operation, while 2T ROM cell preferably to use phosphorus for ROM code implant to get negative Vt0.

33 Claims, 10 Drawing Sheets

|  | Upper Cell's Vt=Vt1<br>Lower Cell's Vt=Vt0 | Upper Cell's Vt=Vt0<br>Lower Cell's Vt=Vt1 |
|---|---|---|
| An=VDD<br>Anb=0V | Logic "0" | Logic "1" |
| An=0V<br>Anb=Vdd | Logic "1" | Logic "0" |

\* Once all the logic input matches the stored memory, the pull down path along the bit line is shut off and it will generate the logic "1".

|  | Upper Cell's Vt=Vt1<br>Lower Cell's Vt=Vt0 | Upper Cell's Vt=Vt0<br>Lower Cell's Vt=Vt1 |
|---|---|---|
| An=VDD<br>Anb=0V | Logic "0" | Logic "1" |
| An=0V<br>Anb=Vdd | Logic "1" | Logic "0" |

\* Once all the logic input matches the stored memory, it will pull down the bit line and generate the logic "0".

＃ FLEXIBLE 2T-BASED FUZZY AND CERTAIN MATCHING ARRAYS

This application claims priority to U.S. Provisional Patent Application Ser. No. 61/461,044, filed Jan. 11, 2011, which is owned by a common assignee, and which is herein incorporated by reference in its entirety.

RELATED APPLICATION

This application is related to the following US patent application issued as U.S. Pat. No. 8,072,811, issued Dec. 6, 2011, titled "NAND based NMOS NOR flash memory cell, a NAND based NMOS NOR flash memory array, and a method of forming a NAND based NMOS NOR flash memory array", application Ser. No. 12/387,771, which is incorporated by reference in their entirety and is assigned to a common assignee as the instant application.

BACKGROUND OF INVENTION (1) Field of the Invention

This invention relates generally to a novel two-transistor (2T) based NVM cell array that is most suitable for traditional Programmable Logic Device (PLD), Programmable Array Logic (PAL) and any matching and comparing function applications.

(2) Description of the Prior Art

In order to implement the above said functions in prior art, each cell uses two 1T NVM transistors connected in parallel with two complementary separate wordlines (WLs) and one common ground as an unit cell to configure it into a NOR-array.

The traditional Programmable Logic Device (PLD) array comprises of a plurality rows and columns. The unit cell is made of two 1T MOS or Bipolar transistors. The MOS PLD prevails on the market place due to its lower power consumption and higher cell scalability over the bipolar counterpart.

Figure 1A:
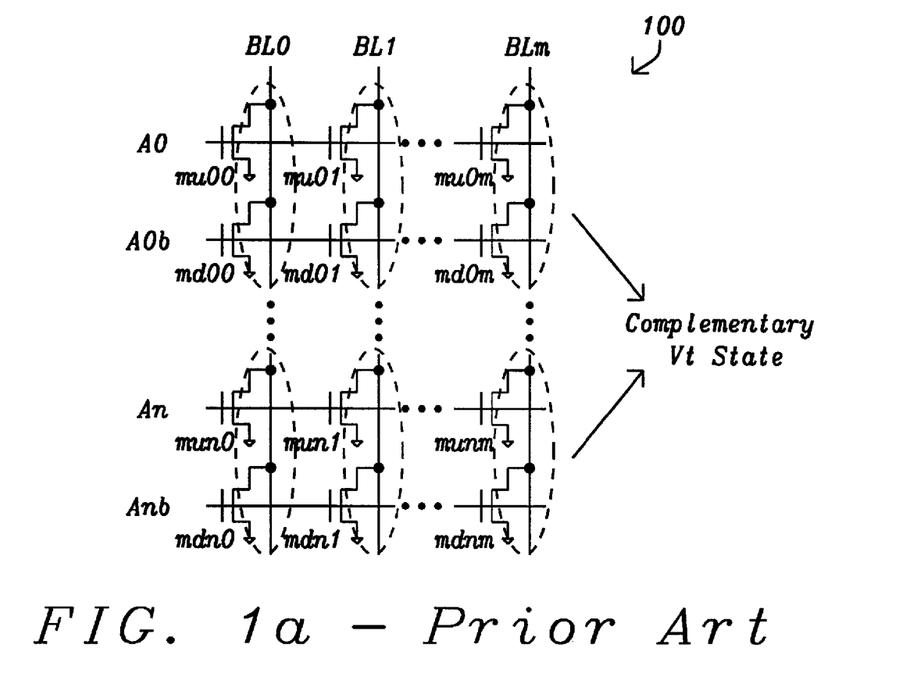
FIG. 1a, prior art, shows n exemplary array of a CMOS PLD ROM-based NOR-array that comprises of (n+1)-paired rows of A0-An and (m+1) columns of BL0-BLm of prior art.

FIG. 1a, prior art, 100, shows an exemplary part of a CMOS PLD ROM-based NOR-array with implemented ROM code that comprises of (n+1)-paired rows of A0-An and (m+1) columns of BL0-BLm of prior art with (n+1) paired logic inputs such as the first pair of A0 and A0b to the last pair of An and Anb. As it was well known in the art, the logic of each column of the array is defined as one product term of (n+1) logic inputs for the PLD logic. For example, BL0 logic is defined as one of the product term as the following A0bxA1bx----xAnb,-------, A0xA1x---An. The m+1 columns of bitlines means it provides m+1 product terms.

The basic unit cell is marked within a circle in FIG. 1a and is one paired 1T transistors such as mun0 and mdn0. The two drain nodes of each pair transistors are connected to one common BLm running in Y-axis as a NOR-array. The two separate gates of one paired transistor are connected to two separate wordlines running in X-axis and are connected to one pair of logic inputs such as An and Anb. There are total 2n+2 transistors are connected to one BL when there are (n+1)-paired logic inputs connected to (n+1) paired gates.

The n input logic has one n-value vector to be matched for each product term for each BL. One bit of input logic is defined as A0=VSS and A0b=VDD or A0=VDD and A0B=VSS. Only one transistor out of one-paired transistors of munm and mdnm is non-conducting in read operation when the predetermined pattern is being matched. There are totally $2^{n+1}$ combinations of logics of n+1 logic inputs. Any logic of any BL of any one product term to be logic high only happens when all n-paired cells' patterns are matched of that selected BL. Just one cell's paired pattern does not latch the input complementary pattern, the selected BL logic would be low. The is also called as the Certain Check Engine that requires 100% matching bits.

Since this array is actually a 1T NOR array, the matching speed is fast. The disadvantage of the ROM-based PLD is that it cannot provide an in-circuit real time programmability. The mask change has to be done in wafer foundry.

Figure 1B:
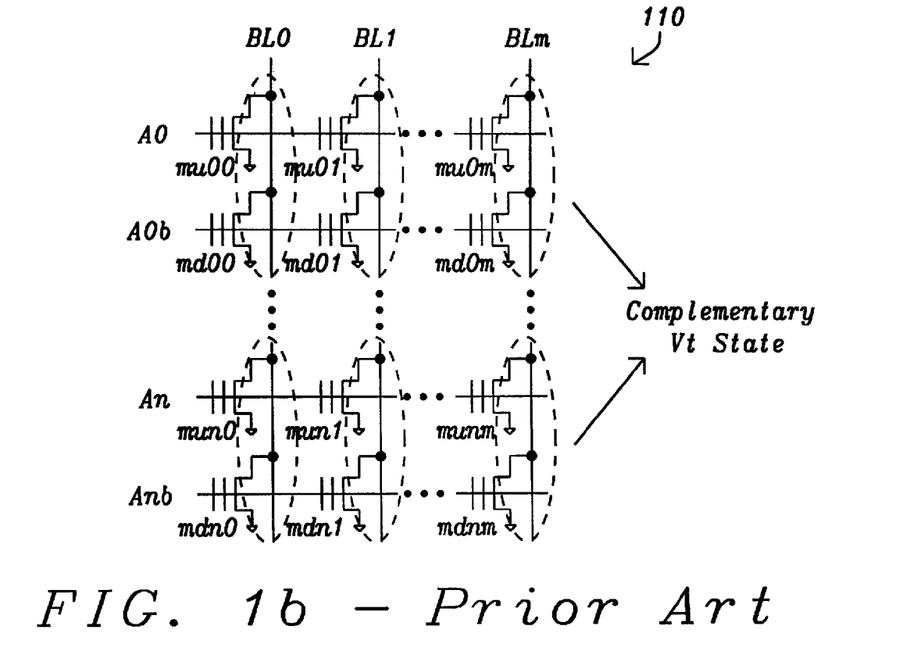
FIG. 1b prior art shows an exemplary array of a CMOS PLD ROM-based Flash-array that comprises of (n+1)-paired rows of A0-An and (m+1) columns of BL0-BLm of prior art.

FIG. 1b prior art, 110, shows a part of a CMOS PLD Flash-based NOR-array with programmable memory that comprises of (n+1)-paired rows of A0-An and (m+1) columns of BL0-BLm of prior art with (n+1) paired logic inputs such as the first pair of A0 and A0b to the last pair of An and Anb. As it was well known in the art, the logic of each column of the array is defined as one product term of (n+1) logic inputs for the PLD logic. For example, BL0 logic is defined as one of the product term as the following A0bxA1bx----xAnb, -------, A0xA1x---An. The m+1 columns of bitlines provide m+1 product terms.

The basic unit cell is marked within a circle in FIG. 1b and is one paired 1T transistors such as munm and mdnm. The two drain nodes of each pair transistors are connected to one common BLm running in Y-axis as a NOR-array. The two separate gates of one paired transistor are connected to two separate wordlines running in X-axis and are connected to one pair of logic inputs such as An and Anb. There are total 2n+2 transistors are connected to one BL when there are (n+1)-paired logic inputs connected to (n+1) paired gates.

The n input logic has one n-value vector to be matched for each product term for each BL. One bit of input logic is defined as A0=VSS and A0b=VDD or A0=VDD and A0B=VSS. Only one transistor out of one-paired transistors of munm and mdnm is conducting in read operation when the predetermined pattern is being matched. There are totally $2^{n+1}$ combinations of logics of n+1 logic inputs. Any logic of any BL of any one product term to be logic high only happens when all n-paired cells' patterns are matched of that selected BL. Similarly like ROM PLD array, just one cell's paired pattern does not latch the input complementary pattern, the selected BL logic would be low. The is also called as the Certain Check Engine that requires 100% matching bits.

Figure 1C:
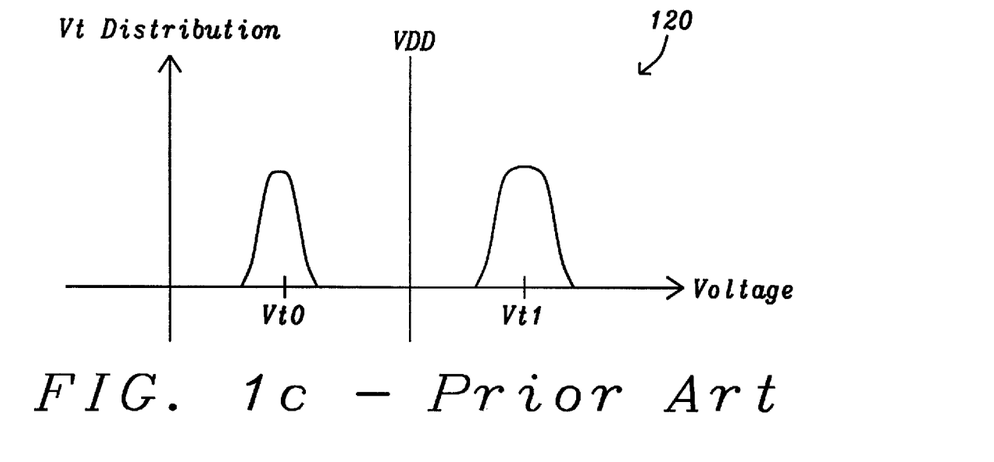
FIG. 1c prior art shows the two Vts of 1T NVM cell used in the NOR-array of prior art.

FIG. 1c prior art shows the two Vts of 1T NVM cell used in the NOR-array of either ROM-based PLD or Flash-based PLD of two prior art in FIG. 1a and FIG. 1b. The Vt0 is the lower Vt state which is defined as the conduction state, while the Vt1 is the high Vt one which is defined as non-conducting state. In this NOR-array, both Vt0 and Vt1 definition have to be set to be positive value for the accurate PLD logic implementation. Any one of negative value of Vt0 or Vt1 would result in the BL leakage, thus malfunction of PLD operation.

The gate voltage levels applied to any paired inputs such as A0 and A0b are complementary such as VSS and VDD. The gate that coupled to VDD voltage has to be set higher than Vt0 but below Vt1 with a good margin to ensure the selected cell of Vt0 is biased in a conducting state for accurate PLD operation. Both Vt0 and Vt1 are not the fixed values but have a Vt distribution in reality. The narrower Vt distribution of Vt0 is the better performance and speed for the lower VDD operation. The width of Vt1 distribution is a "don't-care" as long as the gap between the maximum value of Vt0 and the minimum value of Vt1 is wide enough for clean reading. Another disadvantage of this prior 1T PLD NOR-array is the encountering of the over-erase issue that would increase the hassle of erase time and the design challenge. As a consequence, an over-erase-concern free PLD, Programmable Array Logic (PAL) or matching solution without a sacrifice in read speed and scalability are highly required in many market places.

SUMMARY OF INVENTION

The first object of this invention is to provide a basic unit cell that preferably comprises of one-paired 2T NVM transistors that are connected in series with two separate WLs (gates) and stored with the complementary Vts. Its two separate gates are connected to two inputs with two complementary logics as for traditional applications such as PLD and any matching or comparison functions.

The second object of this invention is to provide a basic unit cell that preferably comprises of n-paired 2T NVM transistors that are all connected in series in a long string with 2n separate WLs (gates). Each paired 2T cell of n 2T cells stored with the similar complementary Vts along with its two separate gates are connecting to two inputs with two complementary logics as for traditional applications such as PLD and any matching or comparison functions.

The third object of this invention is to provide a basic unit cell that preferably comprises of n-paired 2T NVM transistors that are all connected in series in a long string with 2n separate WLs(gates). Each paired 2T of 2nT cell stored with the similar complementary Vts along with its two separate gates are connecting to two inputs with two complementary logics as for traditional applications such as PAL logic functions. The logic input is applied to BL, while the output is the corresponding source line (SL). Once two WL logics are matched with the two complementary cell's Vts, then the Input signal at BL would be passed to output node which is SL The fourth object of this invention is to identify and select a low-voltage ROM transistor for implementing above said one paired 2T NVM cell for PAL, PLD and Matching functions. The two ROM transistors are connected in series in such a way to have two separate WLs (gates) running in X-axis and one common BL running in Y-axis and one common SL in parallel to WL in X-axis. The paired transistors are preferably stored with two complementary Vts of Vt0 and Vt1. The Vt0 is preferably set to be −2V with Phosphorous implant and Vt1 set to be +0.7V as a virgin transistor without any implant dose.

The fifth object of this invention is to identify and select a low-voltage ROM transistor for implementing above said one paired 2T NVM cell. The 2T ROM cell array and cell's Vt assignment are made to be the same as above third objective except the SL layout in array is made to run in Y-axis in parallel to all BL for noise reduction during read operation. Unlike traditional array wherein many BLs share one common SL in X-axis, each single BL has one dedicate SL in parallel.

The sixth object of this invention is to identify and select a high-voltage Flash transistor for implementing above said one paired 2T NVM cell for PAL, PLD and matching functions.

The two Flash transistors are connected in series in such a way to have two separate WLs (gates) running in X-axis and one common BL running in Y-axis and one common SL in parallel to WL in X-axis. The paired transistors are preferably stored with two complementary Vts of Vt0 and Vt1. The Vt0 is defined as erase-state and is preferably set to be −2V with holes stored on floating-gate and Vt1 set to be +0.7V as a virgin transistor without any holes and electrons.

The seventh object of this invention is to identify and select a high-voltage Flash transistor for implementing above said one paired 2T NVM cell. The 2T Flash cell array and cell's Vt assignment are made to be the same as above third objective except the SL layout in array is made to run in Y-axis in parallel to all BL for noise reduction during read operation and better scalability during program operation. Unlike traditional array, many vertical BLs share one common SL running in X-axis, each single BL has one dedicate SL in parallel.

The eighth object of this invention is to identify and select a low-voltage ROM transistor for implementing above said n-paired NAND string, ie, 2nT ROM cell. The 2n ROM transistors are connected in series in such a way to have 2n separate WLs (gates) running in X-axis and one common BL running in Y-axis and one common SL in parallel to WL in X-axis or in parallel to BL in Y-axis.

Each paired transistors of 2nT string cell are preferably stored with two complementary Vts of Vt0 and Vt1. The Vt0 is defined as erase-state and is preferably set to be −2V with holes stored on floating-gate and Vt1 set to be +0.7V as a virgin transistor without any holes and electrons.

The ninth object of this invention is to identify and select a high-voltage Flash transistor for implementing above said n-paired NAND string, ie, 2nT Flash cell. The 2n Flash transistors are connected in series in such a way to have 2n separate WLs (gates) running in X-axis and one common BL running in Y-axis and one common SL in parallel to WL in X-axis or in parallel to BL in Y-axis. Each paired transistors of 2nT string cell are preferably stored with two complementary Vts of Vt0 and Vt1. The Vt0 is defined as erase-state and is preferably set to be −2V with holes stored on floating-gate and Vt1 set to be +0.7V as a virgin transistor without any holes and electrons.

The above flash cell can be any kinds, regardless of PMOS or NMOS cell, 2-poly floating-gate cell or 1-poly SONOS charge-trapping cell, 2D or 3D cell structures;

The tenth object of this invention is to propose a Certain and Fuzzy circuit that works with the above 2T or 2nT NVM arrays for either 100% matching or programmable percentage (<100%) matching functions used in PLD, PAL and any matching functions.

Furthermore an object of the invention is to select highly-scalable NAND and ROM transistors to implement PLD, Pal and other matching circuits using the 2T NAND cell array or 2nT NAND cell array in preferred embodiments of the invention.

BRIEF DESCRIPTION OF THE DRAWINGS

In the accompanying drawings forming a material part of this description, there is shown:

FIG. 2a is the SL layout orientation.

FIG. 2d is the SL layout.

FIG. 4d, is another embodiment of circuit of FIG. 4b of 2nT NAND-based NAND-array of the present invention. The difference between FIG. 4d and FIG. 4b is the SL layout which runs in parallel to each BL as shown for the purpose of noise reduction in read operation and allow better scalability during program operation.

FIG. 8b shows the preferable PAL array of the present invention. The PAL array comprises of 2n rows with 2(n+1) logic inputs such as A0, A0b to An and Anb. Each cell is denoted as a box of 800 which comprises of 2T NAND cell as shown in FIG. 8a.

DESCRIPTION OF THE EMBODIMENTS OF THE INVENTION

Unlike prior art, each PLD, PAL or Comparison cell of the present invention is connected in series as an unit cell to configure it into a NAND-array. The two gates of each 2T-cell are connected to two wordlines (WLs), which are connected to two complementary logic inputs. The two threshold voltages (Vts) of 2T non-volatile memory (NVM) transistors are also made complementary for the accurate PLD, PAL and Comparison implementation. For n-bit logic inputs, then the total number of WLs would be 2n which is due to the n paired 2T cells' gates number plus one common BL (Biltine).

Similarly, another embodiment of the present invention is to extend the 2T-cell NAND-array to 2nT-cell NAND array for n-bit PAL, PLD and matching and comparison functions, comprises of 2n Flash transistors that are also connected in series as a n-bit unit storage cell. The preferable NVM transistors of 2T cell or 2nT cell of the present invention are using the traditional LV (low-voltage) ROM or HV (high-voltage) Flash transistors.

Owing to write function in the Flash transistors, the required high voltage is normally applied to a range of about 15V~20V which depends on many factors such as the cell's coupling ratio, the thickness of the tunneling oxide Each 2T ROM cell can be like NAND-type ROM by using Phosphorous implant to change the virgin Vt of 0.7V to the negative Vt of −2V, while Flash transistor can be any kind but it is more preferable to use the highly-scalable NAND-type cell, regardless of 2-poly floating-gate or 1-poly charge-trapping flash device, PMOS or NMOS flash devices or 2D or 3D flash devices.

NAND flash transistors have many advantages over other flash transistors in terms of its highest cell scalability and lowest program and erase Fowler-Nordheim (FN) current. NAND flash use floating-gate transistors being connected in a way that resembles a NAND gate, i.e. several transistors are connected in series, and only if all word lines are pulled high (above the transistors' $V_T$) is the bit line pulled low. To read, most of the word lines are pulled up above the $V_T$ of a programmed bit, while one of them is pulled up to just over the $V_T$ of an erased bit. The series group will conduct (and pull the bit line low) if the selected bit has not been programmed.

The two NAND flash transistors are connected in series as a unit cell with its two gates preferably connected to the paired but complementary logic inputs. Both program and erase operations just follow the conditions of the traditional NAND flash cell to and same manufacturing process. Unlike the traditional PAL or PLD, using 1T cell in cell array, this novel 2T or 2nT cell arrays would be completely free from the long-held concern of over-erase.

More particularly, this invention relates to some special NAND-based or ROM-based PLD and PAL arrays. Due to its highest scalability, their memory density of the present invention can be increased up to Giga-byte level without any over-erase concern when the technology node of 20 nm is used. As a result, a very fast erase and program operation can be also achieved. In addition, since two Vts of the NAND transistor can be set at a much lower values of about −2.0V (Vt0) and +1.0V (Vt1), a fast read operation for PLD, PAL and matching functions can also be comparably accomplished as the traditional PLD and PAL implantation which uses 1T cell.

The concepts of the present invention can be also extended to those traditional Smart-card IC designs that always require a real-time check and comparison between the input reading biometric data and the on-chip stored data. These stored biometric data include finger-print, facial and iris pictures etc.

Figure 2A:
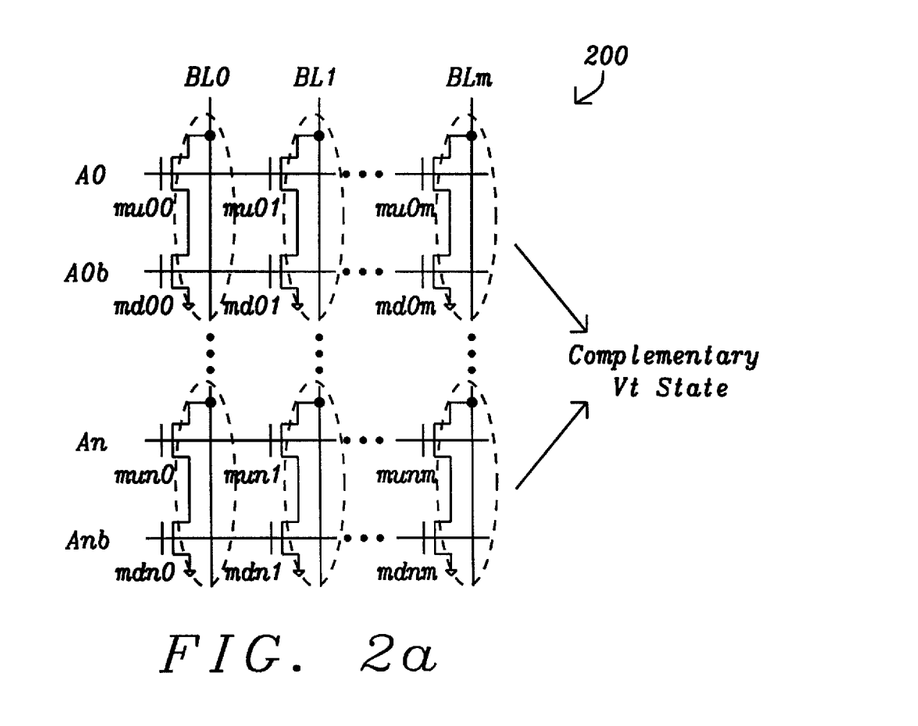
FIG. 2a shows a part of a CMOS PLD preferable with 2T ROM-based NAND-array that comprises of similar (n+1)-paired horizontal rows (A0-An) and m+1 vertical columns of BLs of the present invention with (n+1) paired logic inputs such as the first pair of A0 and A0b to the last pair of An and Anb.

FIG. 2a, 200, shows a part of a CMOS PLD with 2T ROM-based NAND-array that comprises similar (n+1)-paired horizontal rows (A0-An) and m+1 vertical columns of BLs of the present invention with (n+1) paired logic inputs such as the first pair of A0 and A0b to the last pair of An and Anb. Similarly, the logic of each column of the array is being defined as the product term of (n+1) logic inputs for the PLD logic. The m+1 columns of bitlines mean provide m+1 product terms. Unlike prior art each cell is connected in series from each common vertical bitline point of view of the present invention. The two gates of 2T are similarly connected to each paired logic inputs of An and Anb. The sourceline SL is laid out in x-axis in parallel to two WLS of An and Anb.

The two Vts of one-paired 2T ROM cells are complementary and are connected to respective An and Anb logic inputs. As opposite to the conventional 1T-NOR array, this is a 2T-NAND array. As a result, the two Vt assignments are changed to have one negative Vt0 and one positive Vt1. The lower Vt0 can be −2.0V, which is the conducting state with Phosphorous implant, while the higher Vt1 of 0.7V, which is defined as a non-conducting state without getting any implant. The layout option of SL is laid out in x-axis in parallel to all pairs of An and Anb.

The n input logic of the 2T NAND array of the present invention has one n-value vector to be matched for each product term for each BL. One bit of input logic is defined as A0=VSS and A0b=VDD or A0=VDD and A0B=VSS.

In the present invention 2T are connected in series, both transistors of any one-paired transistors of munm and mdnm have to conduct in read operation when the predetermined pattern is being matched. Similarly, there are totally $2^{n+1}$ combinations of logics of n+1 logic inputs. Any logic of any BL of any one product term to be logic high only happens when all n-paired cells' patterns are matched of that selected BL. Similarly like ROM PLD array, just one cell's paired pattern does not latch the input complementary pattern, the selected BL logic would be low. This is also called the Certain Check Engine that requires 100% matching bits.

Figure 2B:
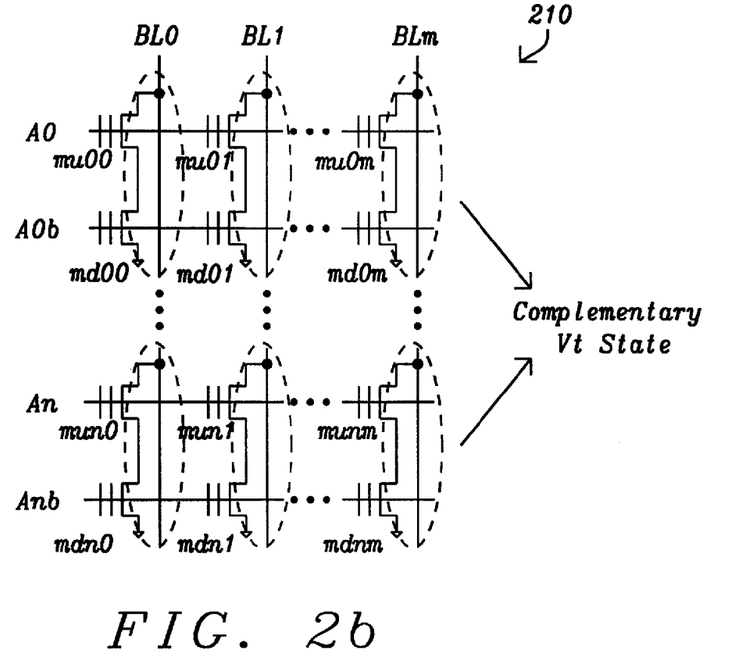
FIG. 2b shows a part of CMOS PLD preferable Flash-based NAND-array that comprises of similar (n+1)-paired horizontal rows (A0-An) and m+1 vertical columns of BLs of the present invention with (n+1) paired logic inputs such as the first pair of A0 and A0b to the last pair of An and Anb.

FIG. 2b, 210, shows a part of CMOS PLD Flash-based NAND-array that comprises similar (n+1)-paired horizontal rows (A0-An) and m+1 vertical columns of BLs of the present invention with (n+1) paired logic inputs such as the first pair of A0 and A0b to the last pair of An and Anb. Similarly, the logic of each column of the array is being defined as the product term of (n+1) logic inputs for the PLD logic. M+1 column of bitlines means it provides the m+1 product terms. Unlike the prior art, each basic PLD cell is still 2T but is connected in series from each common vertical bitline point of view of the present invention. The two gates of 2T are similarly connected to each paired logic inputs of An and Anb. The sourceline SL is laid out in x-axis in parallel to two WLS of An and Anb.

The two Vts of one-paired 1T Flash cells are complementary and are connected to respective An and Anb logic inputs. As opposite to the conventional 1T-NOR array, this is the 2T-NAND array. As a result, the two Vt assignments would be changed to have one negative Vt0 and one positive Vt1. The lower Vt0 can be −2.0V, which is the conducting state with Phosphorous implant, while the higher Vt1 of 0.7V, which is defined as a non-conducting state without getting any implant. The option of SL is laid out in x-axis in parallel to all pairs of An and Anb. Similarly to FIG. 2a, both Flash transistors of one-paired cell must conduct current when input logic matches the stored data of munm and mdnm. When all n-input logic are matched for any column, the output of BLm would become high. As result, this 2T Flash-based PLD can achieve the exactly identical PLD function as the traditional 2T NOR-array PLD functions.

Figure 2C:
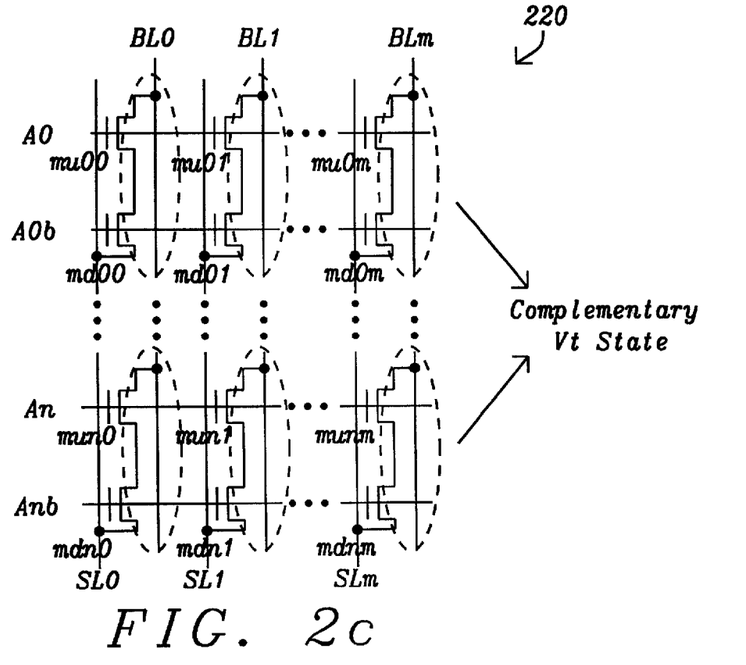
FIG. 2c shows another embodiment of a CMOS PLD preferable ROM-based NAND-array that comprises of similar (n+1)-paired horizontal rows (A0-An) and m+1 vertical columns of BLs of the present invention with (n+1) paired logic inputs such as the first pair of A0 and A0b to the last pair of An and Anb like FIG. 2a. The difference between FIG. 2c

FIG. 2c, 220, shows another embodiment of a CMOS PLD preferable ROM-based NAND-array that comprises similar (n+1)-paired horizontal rows (A0-An) and m+1 vertical columns of BLs of the present invention with (n+1) paired logic inputs such as the first pair of A0 and A0b to the last pair of An and Anb like FIG. 2a.

The only difference between FIG. 2a and FIG. 2c is the SL layout of orientation. In FIG. 2c, the SL layout has been preferably changed to run from X-axis to vertical Y-axis direction in parallel to all BLn. With this change, each horizontal SL noise in prior art can be reduced a lot due to in worst-case scenario only n+1 2T cells conducting current from one BLn through during read operation.

Figure 2D:
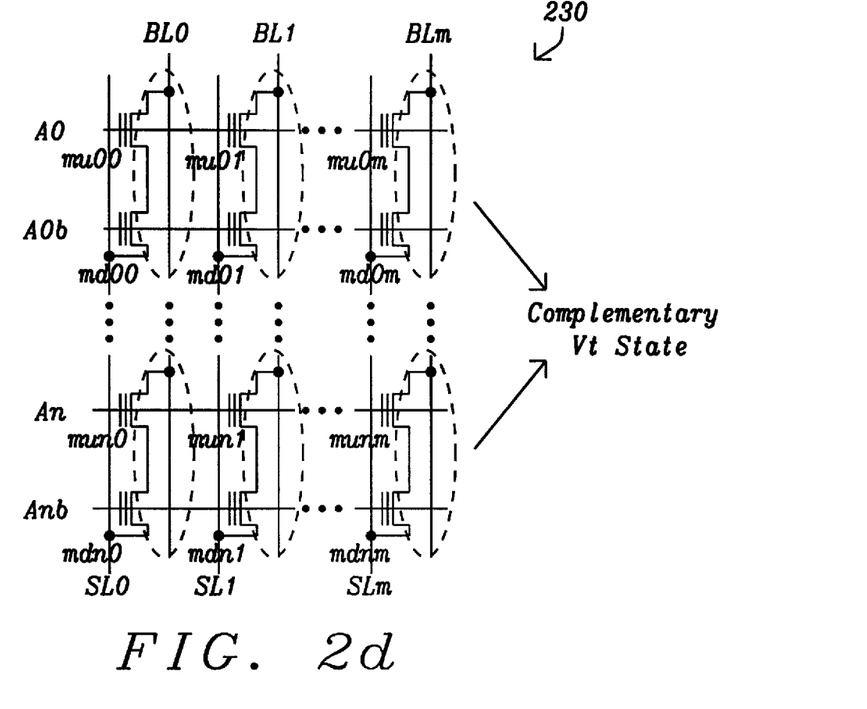
FIG. 2d shows another embodiment of a CMOS PLD preferable Flash-based NAND-array that comprises of similar (n+1)-paired horizontal rows (A0-An) and m+1 vertical columns of BLs of the present invention with (n+1) paired logic inputs such as the first pair of A0 and A0b to the last pair of An and Anb as shown in FIG. 2b. The only difference between FIG. 2b

FIG. 2d, 230, shows another embodiment of a CMOS PLD preferable Flash-based NAND-array that comprises of similar (n+1)-paired horizontal rows (A0-An) and m+1 vertical columns of BLs of the present invention with (n+1) paired logic inputs such as the first pair of A0 and A0b to the last pair of An and Anb as shown in FIG. 2b.

The only difference between FIG. 2b and FIG. 2d is the SL layout. Similarly, in FIG. 2d, the SL layout has been preferably changed to run from x-axis to vertical y-axis direction in parallel to all BLn. With this change, each horizontal SL noise in prior art can be reduced a lot due to only n+1 cells conducting current during read operation.

Figure 2E:
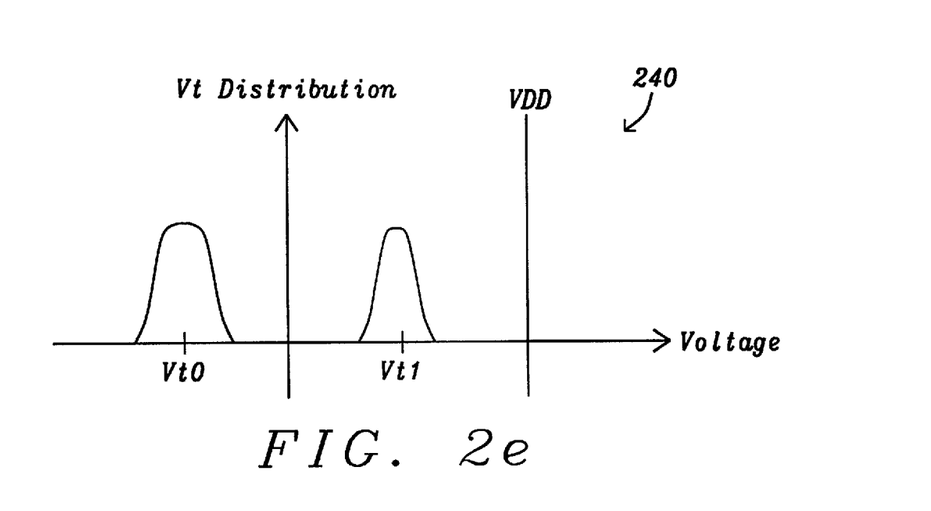
FIG. 2e shows two Vts of 1T Flash cell used in the NAND-array.

FIG. 2e shows the two Vts of 1T Flash cell used in the NAND-array. Vt0 is lower Vt state which is defined as the conduction Vt state, while the Vt1 is the high Vt one which is defined as non-conducting state. The gate voltage levels applied to any paired inputs such as A0 and A0b are complementary such as VSS and VDD. One of the gate coupled to VDD voltage has to be set higher than Vt1 for conduction. Similarly, the second gate voltage has to be set 0V which is higher than the maximum value of negative Vt0 but below the positive minimum value of Vt1. Both Vt0 and Vt1 are not the fixed values but have a Vt distribution in reality. The narrower Vt0 and Vt1 distribution, the better speed performance at the lower VDD in read operation can be achieved.

Figure 3:
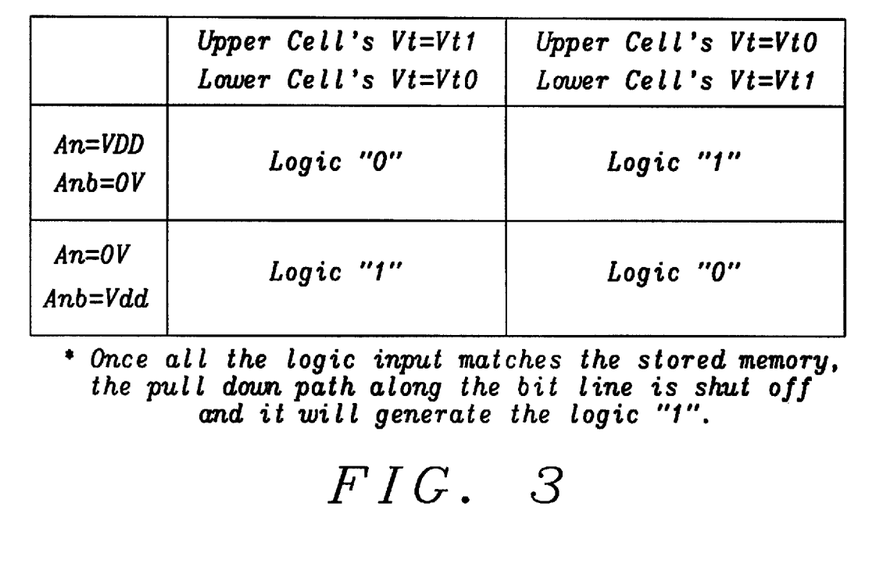
FIG. 3 shows a table that defines the Logic "0" and Logic "1" of the NAND-based PAL array of the present invention.

FIG. 3 shows a table that defines the Logic "0" and Logic "1" of the NAND-based PAL array of the present invention. Similarly, each paired Flash cell is set to be complementary with one negative Vt0 and one positive Vt1 for the purpose of accurate implementation of PLD logic. In regard of logic "1" it should be noted that once all logic input matches the stored memory, the pull down path along the bit line is shut off and it will generate the logic "1".

Figure 4A:
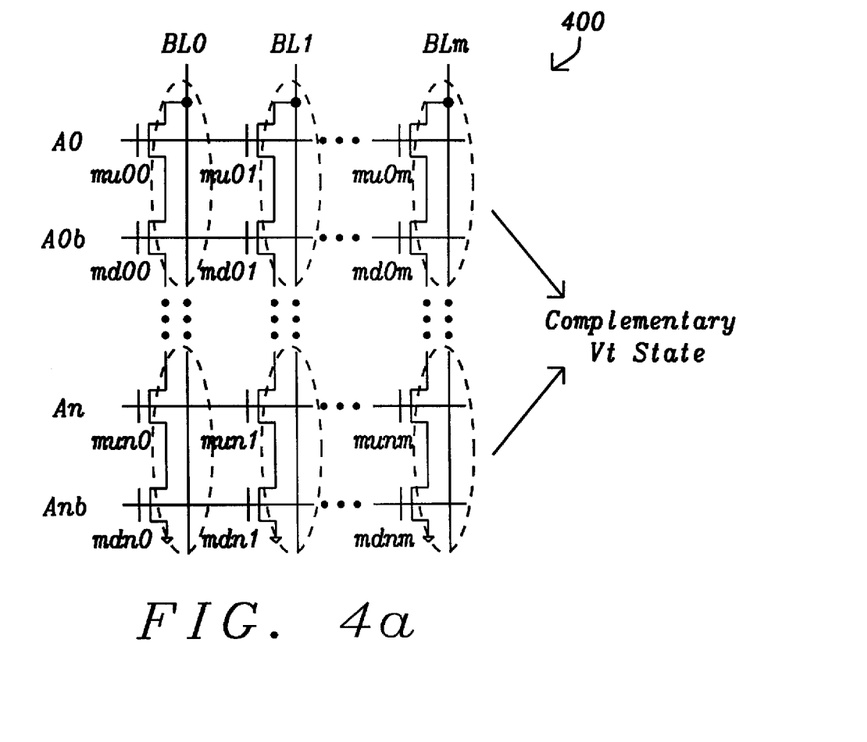
FIG. 4a shows another embodiment of a CMOS PLD with preferable 2nT ROM-based NAND-array that comprises of similar (n+1)-paired horizontal rows (A0-An) and m+1 vertical columns of BLs of the present invention with (n+1) paired logic inputs.

FIG. 4a, 400, shows another embodiment of a CMOS PLD with preferable 2nT ROM-based NAND-array that comprises of similar (n+1)-paired horizontal rows (A0-An) and m+1 vertical columns of BLs of the present invention with (n+1) paired logic inputs such as the first pair of A0 and A0b to the last pair of An and Anb. Similarly, the logic of each column of the array is being defined as the product term of (n+1) logic inputs for the PLD logic. M+1 column of bitlines provide m+1 product terms. Unlike FIG. 2a, each basic PLD cell has 2nT transistors but is preferably connected in series, rather than in parallel from each common vertical bitline point of view of the present invention. The 2n gates of 2nT are similarly connected to n paired logic inputs of An and Anb. The sourceline SL is laid out in x-axis in parallel to two WLS of An and Anb.

The two Vts of one-paired 1T ROM cells are complementary and are connected to respective An and Anb logic inputs. As opposite to the conventional 1T-NOR array, this is the 2nT-NAND array. As a result, the two Vt assignments would be changed to have one negative Vt0 and one positive Vt1. The lower Vt0 can be −2.0V, which is the conducting state with Phosphorous implant, while the higher Vt1 of 0.7V, which is defined as a non-conducting state without getting any implant. The layout option of SL is laid out in x-axis in parallel to all pairs of An and Anb as we defined them for FIG. 2a.

Figure 4B:
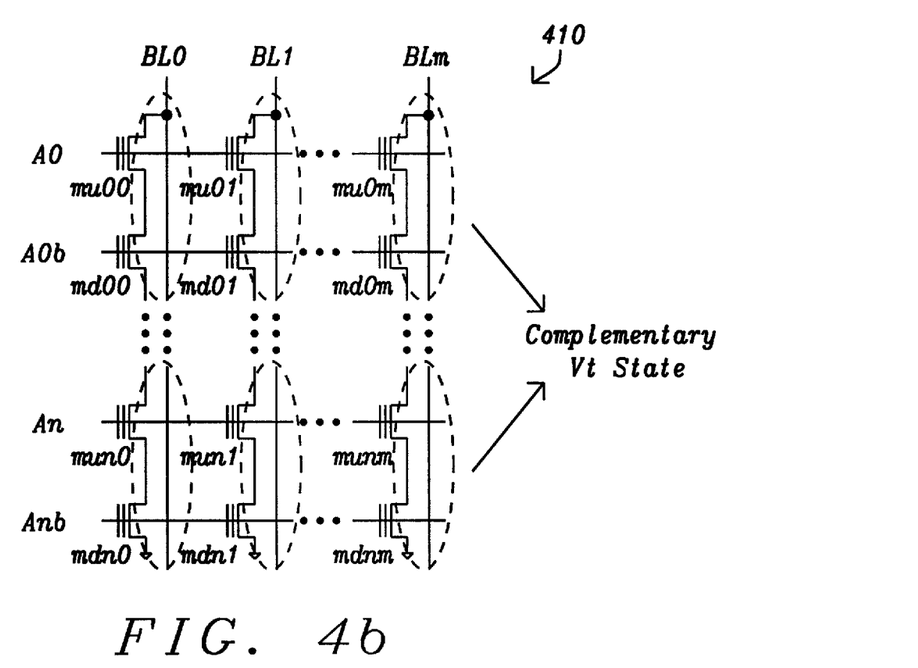
FIG. 4b shows another embodiment of a CMOS PLD with preferable 2nT Flash-based NAND-array that comprises of similar (n+1)-paired horizontal rows (A0-An) and m+1 vertical columns of BLs of the present invention with (n+1) paired logic inputs.

FIG. 4b, 410, shows another embodiment of a CMOS PLD with preferable 2nT Flash-based NAND-array that comprises of similar (n+1)-paired horizontal rows (A0-An) and m+1 vertical columns of BLs of the present invention with (n+1) paired logic inputs such as the first pair of A0 and A0b to the last pair of An and Anb. Similarly, the logic of each column of the array is being defined as the product term of (n+1) logic inputs for the PLD logic. M+1 column of bitlines means it provides the m+1 product terms. Unlike FIG. 2a, each basic PLD cell has 2nT transistors but is preferably connected in series, rather than in parallel from each common vertical bitline point of view of the present invention. The 2n gates of 2nT are similarly connected to n paired logic inputs of An and Anb. The sourceline SL is laid out in x-axis in parallel to two WLS of An and Anb.

Figure 4C:
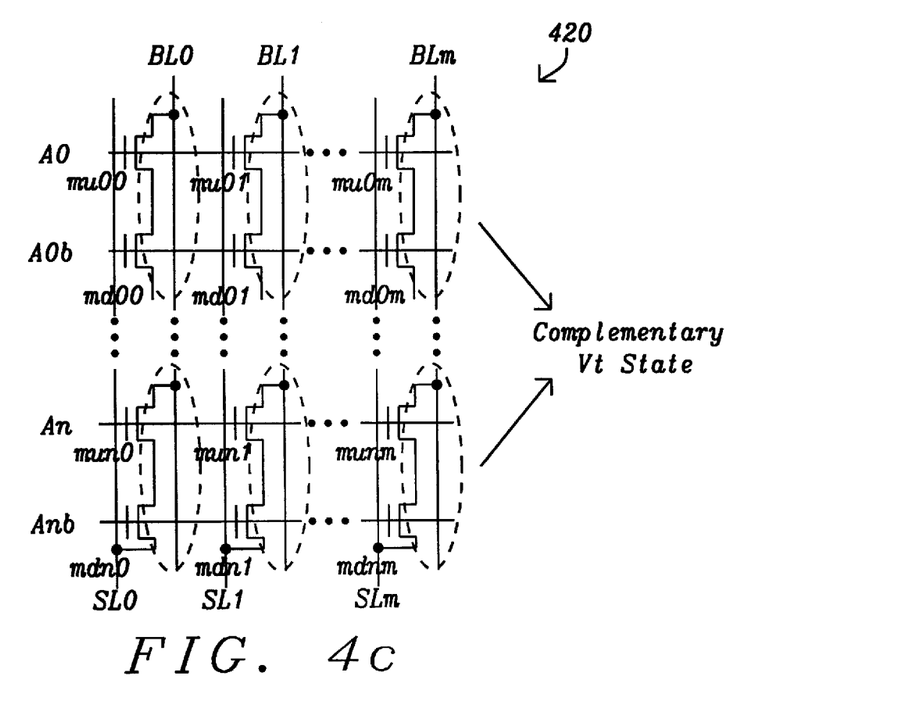
FIG. 4c, is another embodiment of circuit of FIG. 4a of ROM-based NAND-array of the present invention. The difference between FIG. 4a and FIG. 4c is the SL layout which runs in parallel to each BL as shown for the purpose of noise reduction. The two Vt definition is like the one shown in FIG. 2e.

FIG. 4c, 420, is another embodiment of circuit of FIG. 4a of ROM-based NAND-array of the present invention. The difference between FIG. 4a and FIG. 4c is the SL layout which runs in parallel to each BL as shown for the purpose of noise reduction. The two Vt definition is like the one shown in FIG. 2e.

Figure 4D:
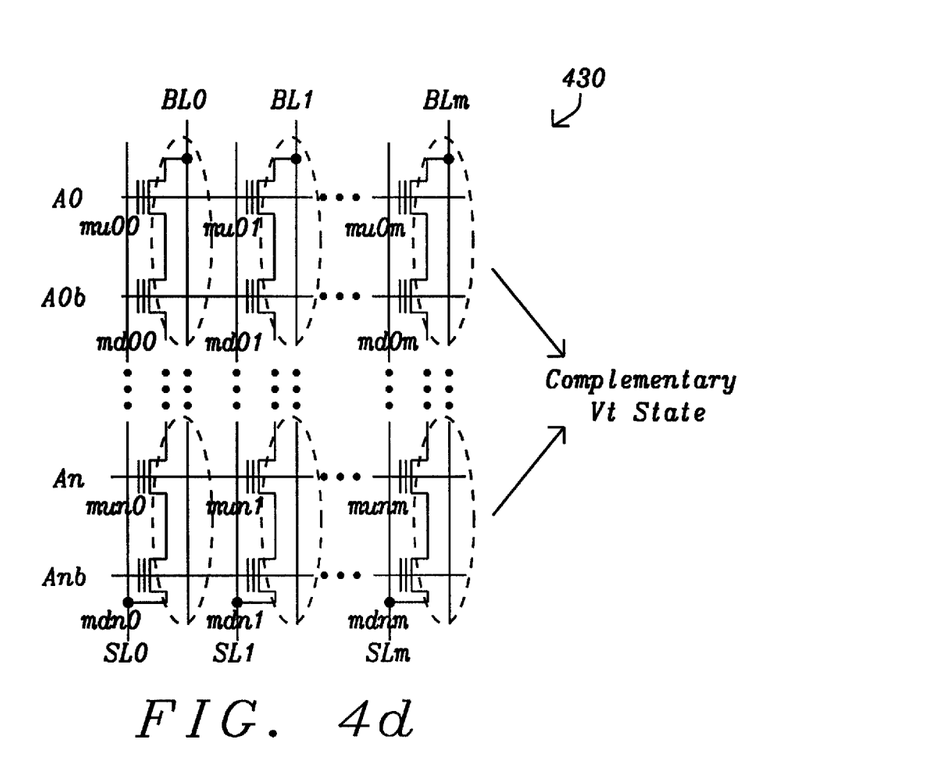

FIG. 4d, 430, is another embodiment of circuit of FIG. 4b of 2nT NAND-based NAND-array of the present invention. The difference between FIG. 4d and FIG. 4b is the source line (SL) layout which runs in parallel to each BL as shown for the purpose of noise reduction in read operation and allows better scalability during program operation.

Figure 4E:
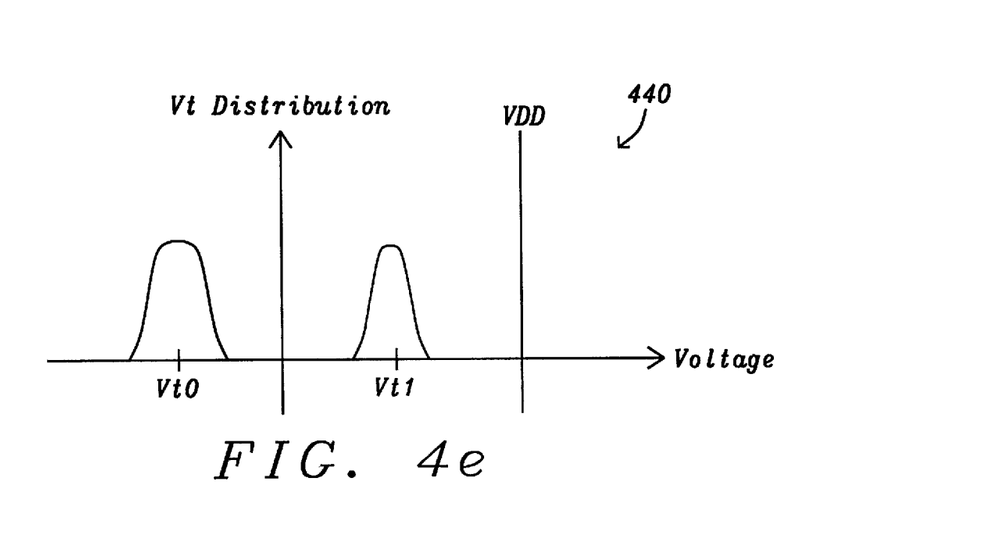
FIG. 4e shows two preferable cell Vt distribution for both FIG. 3c and FIG. 3d. The narrower Vt0 and Vt1 distributions is better for more reliable Read operation.

FIG. 4e shows two preferable cell Vt distribution for both FIG. 3c and FIG. 3d. The narrower Vt0 and Vt1 distributions is better for more reliable Read operation.

Figure 5:
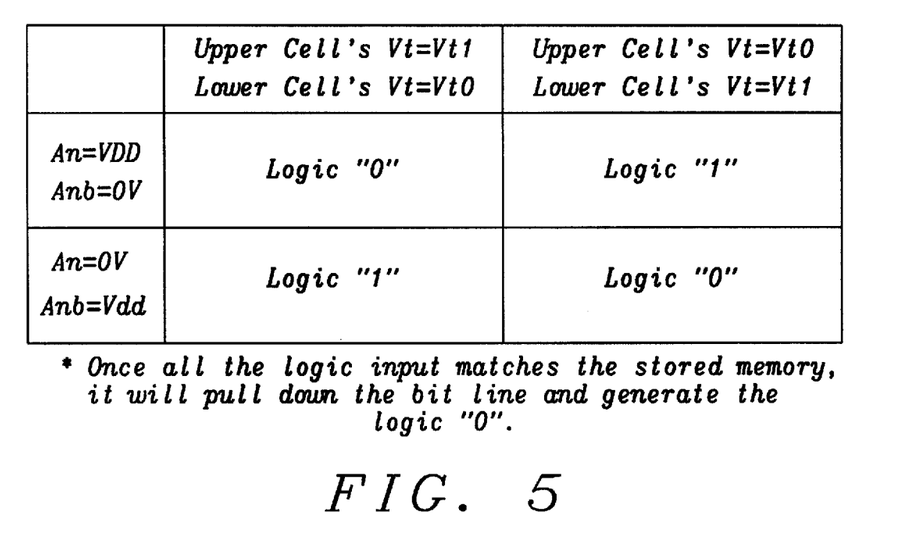
FIG. 5 shows a table that defines the Logic "0" and Logic "1" of the 2nT NAND-based PAL array of the present invention.

FIG. 5 shows a table that defines the Logic "0" and Logic "1" of the 2nT NAND-based PAL array of the present invention. Similarly to FIG. 3, each paired of Flash cells are set to be complementary with one negative Vt0 and one positive Vt1 for the purpose of accurate implementation of PLD logic.

Figure 6:
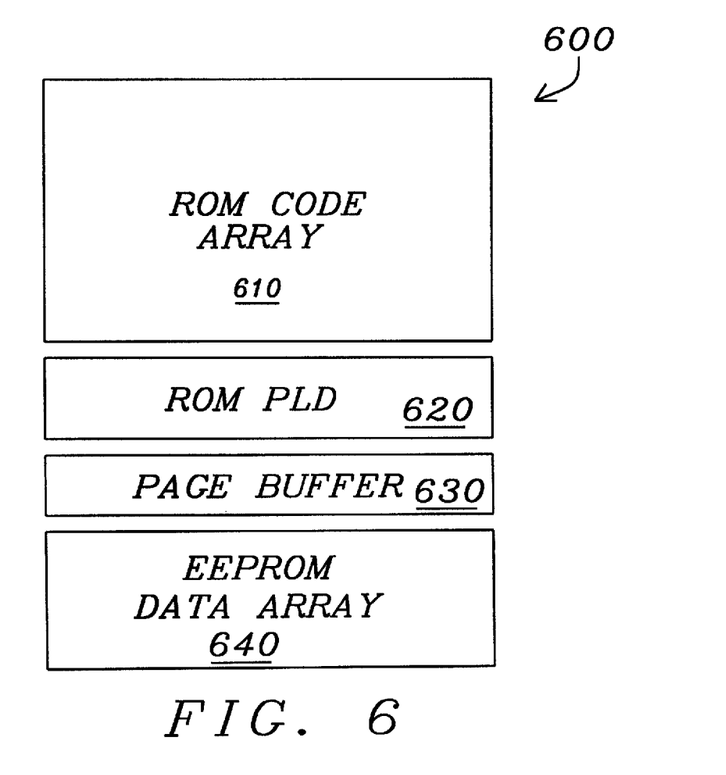
FIG. 6 shows a block diagram for one-chip smart-card IC design. The above said 2T ROM-based NAND-array or 2nT ROM-based NAND-array can be used to make the on-chip PLD on the same die with EEPROM and Code NVM.

FIG. 6 shows a block diagram for one-chip smart-card IC design. The above said 2T ROM-based NAND-array or 2nT ROM-based NAND-array can be used to make the on-chip PLD on the same die with EEPROM and Code NVM.

Figure 7:
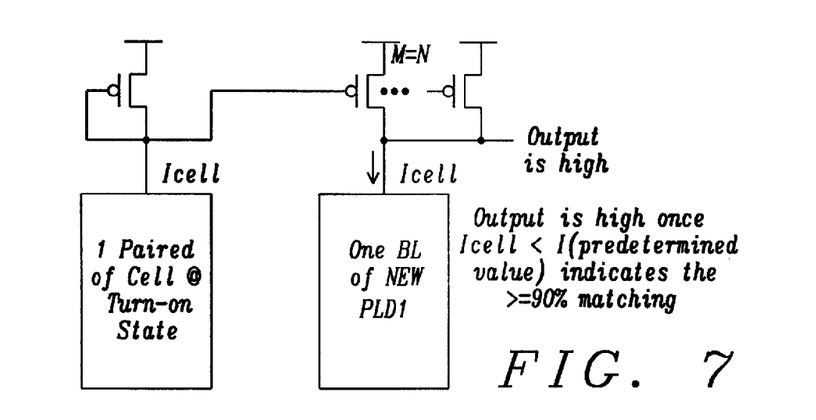
FIG. 7 shows another embodiment that allows a flexible PLD configuration in reference voltage for both Certain and Fuzzy comparisons. It allows about 10% current variation of each column due to 10% unmatched data in each selected BL.

FIG. 7 shows another embodiment that allows a flexible PLD configuration in reference voltage for both Certain and Fuzzy comparisons. It allows about 10% current variation of each column due to 10% unmatched data in each selected BL.

Figure 8A:
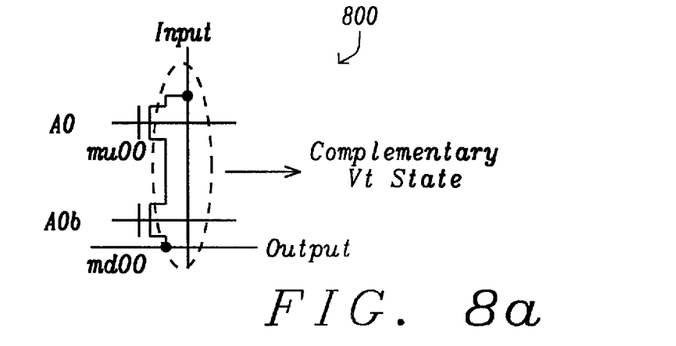
FIG. 8a shows another embodiment that allows a flexible PAL bit configuration in reference voltage for both Certain and Fuzzy comparisons. It allows about 10% current variation of each column due to 10% unmatched data in each selected BL.

FIG. 8a shows another embodiment 800, that allows a flexible PAL bit configuration in reference voltage for both Certain and Fuzzy comparisons. It allows about 10% current variation of each column due to 10% unmatched data in each selected BL. The source line (SL) is defined as the output, In other words, OUTn could be programmed as any one of IN0~INm once logic input paired of An & Anb match the stored state of the paired cells along the WL.

Figure 8B:
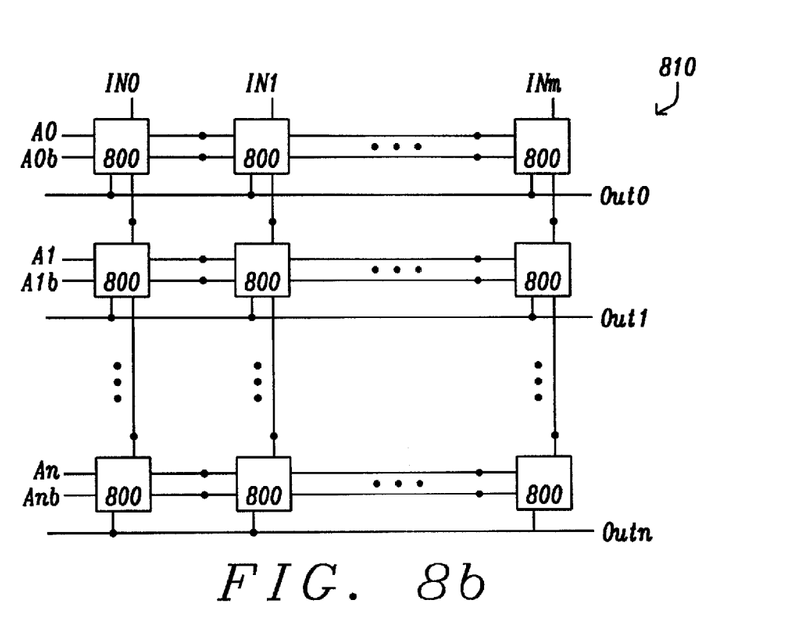

FIG. 8b shows a preferable PAL array of the present invention. The PAL array comprises of 2n rows with 2(n+1) logic inputs such as A0, A0b to An and Anb. Each cell is denoted as a box oc 800 which comprises of 2T NAND cell as shown in FIG. 8a.

Totally, there are many combinations of $2^{n+1}$ logic inputs to route the m+1 inputs such as IN0 to INm to n outputs such as Out0 to Outn. The disadvantage of this 2T NAND cell new PAL circuit is the high resistance in the select signal path as compared to the traditional PAL circuit that has faster read path speed. But the advantage is that the density can be higher.

Note, all flash transistors mentioned above are preferably to use NAND cells that use both low-current FN scheme for program and erase operation.

Figure 9:
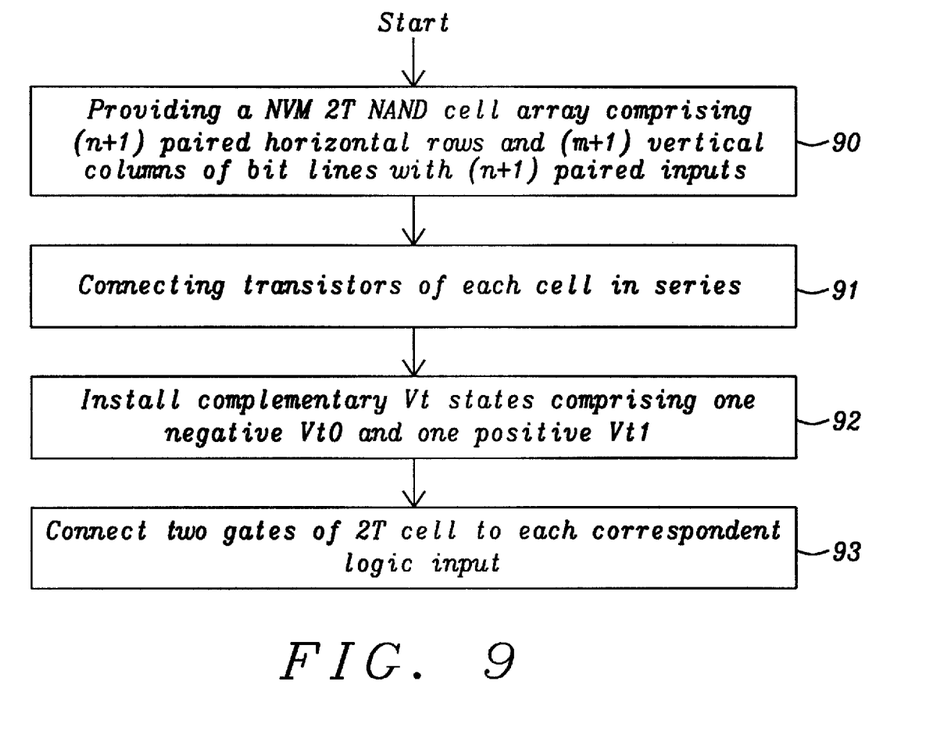
FIG. 9 is flowchart illustrating a method to achieve a NVM 2T cell array, free from over-erase, that is suitable for PLD, PAL and any matching and comparing function applications.

FIG. 9 is flowchart illustrating a method to achieve a NVM cell array, free from over-erase, that is suitable for PLD, PAL and any matching and comparing function applications. Step 90 depicts providing a NVM 2T NAND cell array comprising (n+1) paired horizontal rows and (m+1) vertical columns of bit lines with (n+1) paired inputs. Step 91 illustrates connecting transistors of each cell in series. Step 92 describes installing complementary Vt states comprising one negative Vto and one positive Vt1 and finally step 93 shows connecting two gates of 2T cell to each correspondent logic input.

While the invention has been particularly shown and described with reference to the preferred embodiments thereof, it will be understood by those skilled in the art that various changes in form and details may be made without departing from the spirit and scope of the invention.

What is claimed is:

1. A basic unit cell of a NVM NAND cell array, free from over-erase, that is suitable for PLD, PAL and any matching and comparing function applications, each cell comprising:
 a pair of 2T NVM transistors that are connected in series, configured into a NAND cell, with two separate gates used as wordlines made with two complementary VTs, wherein the separate gates are connected to two complementary inputs with two complementary logics and wherein said NAND array comprises (n+1)-paired horizontal rows and m+1 vertical columns of bit lines with (n+1) paired logic inputs and wherein the logic of each column of the array is being defined as the product term of (n+1) logic inputs.

2. The NVM cell array of claim 1 wherein the paired transistors are stored with two complementary Vts of Vt0 and Vt1.

3. The NVM cell array of claim 1 wherein said 2T NVM cell is used for a Certain and Fuzzy circuit for either 100% matching or programmable percentage (<100%) matching functions used in PLD, PAL and any other matching functions.

4. The NVM cell array of claim 1 wherein the NVM NAND cell array is a 2T ROM based NAND array.

5. The NVM cell array of claim 4 wherein low-voltage ROM transistors for implementing said one paired 2T NVM cell are selected, wherein the two ROM transistors are connected in series in such a way to have two separate word lines running in X-axis and one common bit line running in Y-axis and one common source line in parallel to the word lines in X-axis and the paired transistors are stored with two complementary Vts of Vt0 and Vt1.

6. The NVM cell array of claim 5 wherein the Vt0 is preferably set to be −2V with Phosphorous implant and Vt1 set to be +0.7V as a virgin transistor without any implant dose.

7. The NVM cell array of claim 4 wherein a low-voltage ROM transistor for implementing said one paired 2T NVM cell is selected, wherein the two ROM transistors are connected in series in such a way to have two separate word lines running in X-axis and one common bit line running in Y-axis and source line layout is made to run in Y-axis in parallel to all bit lines and wherein each single bit line has one dedicated source line in parallel.

8. The NVM cell array of claim 1 wherein the NVM NAND cell array is a 2T Flash based NAND array.

9. The 2T Flash based NAND array of claim 8 wherein each Flash transistor is of a NAND flash transistor type.

10. The 2T Flash based NAND array of claim 8 wherein a high-voltage Flash transistor for implementing said one paired 2T NVM cell is selected, wherein the two Flash transistors are connected in series in such a way to have two separate word lines running in X-axis and one common bit line running in Y-axis and one common source line in parallel to word lines in X-axis, wherein the paired transistors are stored with two complementary Vts of Vt0 and Vt1.

11. The 2T Flash based NAND array of claim 10 wherein Vto is defined as erase state and is preferably set to be about −2V with holes stored on floating gate and Vt1 set about +0.7V as a virgin transistor without any holes and electrons.

12. The 2T Flash based NAND array of claim 8 wherein a high-voltage Flash transistor for implementing said one paired 2T NVM cell is selected, wherein the two Flash transistors are connected in series in such a way to have two separate word lines running in X-axis and one common bit line running in Y-axis and the source line layout array is made to run in Y-axis in parallel to all bit lines, and wherein each single bit line has one dedicate source line in parallel.

13. The 2T Flash based NAND array of claim 8 wherein flash cell transistors can be any kinds, regardless of PMOS or NMOS cell, 2-poly floating-gate cell or 1-poly SONOS charge-trapping cell, 2D or 3D cell structures.

14. A NVM 2nT NAND array, free from over-erase, that is suitable for PLD, PAL and any matching and comparing function applications, each cell comprising:
n paired 2T NVM transistors that are all connected in series in a long string configured as a NAND array with 2n separate gates used as wordlines made with two complementary VTs wherein each paired 2T cell of n 2T cells is stored with the similar complementary Vts along with its two separate gates are connecting to two inputs with two complementary logics.

15. The NVM cell array of claim 14 wherein for n-bit logic input the total number of WLs would be 2n which is due to the n paired 2T unit cells' gates number plus one common BL.

16. The NVM cell array of claim 14 wherein the paired transistors are stored with two complementary Vts of Vt0 and Vt1.

17. The NVM cell array of claim 16 wherein Vt0 is set about −2V with Phosphorous implant and Vt1 set about +0.7V as a virgin transistor without any implant dose.

18. The NVM cell array of claim 14 wherein a logic input is applied to a bit line, while an output is via a corresponding source line, wherein once two word line logics are matched with the two complementary cell's Vts, then the Input signal at the bit line would be passed to an output node, which is a source line.

19. The NVM cell array of claim 14 wherein said array is a 2nT ROM-based array.

20. The NVM cell array of claim 19 wherein a low-voltage ROM transistor for implementing above said n-paired 2nT ROM cell NAND string is selected, wherein the 2n ROM transistors are connected in series in such a way to have 2n separate word lines running in X-axis and one common bit line running in Y-axis and one common source line in parallel to word line in X-axis or in parallel to bit line in Y-axis and wherein each paired transistors of 2nT string cell are preferably stored with two complementary Vts of Vt0 and Vt1.

21. The NVM cell array of claim 20 wherein the Vt0 is defined as erase-state and is preferably set to about −2V with holes stored on floating-gate and Vt1 set to about +0.7V as a virgin transistor without any holes and electrons.

22. The NVM cell array of claim 14 wherein said array is a 2nT Flash-based array.

23. The NVM cell array of claim 22 wherein each Flash transistor is of a NAND flash transistor type.

24. The NVM cell array of claim 22 wherein a high-voltage Flash transistor for implementing above said n-paired 2nT NAND 2nT Flash cell string is selected, wherein the 2n Flash transistors are connected in series in such a way to have 2n separate WLs (gates) running in X-axis and one common BL running in Y-axis and one common SL in parallel to WL in X-axis or in parallel to BL in Y-axis and wherein each paired transistor of 2nT string cell is preferably stored with two complementary Vts of Vt0 and Vt1.

25. The NVM cell array of claim 24 wherein the Vt0 is defined as erase-state and is preferably set to be −2V with holes stored on floating-gate and Vt1 set to be +0.7V as a virgin transistor without any holes and electrons.

26. The NVM cell array of claim 22 wherein all flash transistors are using NAND cells that use both low-current Fowler-Nordheim scheme for program and erase operation.

27. A method to achieve a NVM cell array, free from over-erase, that is suitable for PLD, PAL and any matching and comparing function applications, comprising steps of:
providing a NVM 2T NAND cell array comprising (n+1) paired horizontal rows and (m+1) vertical columns of bit lines with (n+1) paired inputs;
connecting transistors of each cell in series;
installing complementary Vt states comprising one negative Vto and one positive Vt1; and
connecting two gates of 2T cell to each correspondent logic input.

28. The method of claim 27 wherein said NVM 2T NAND cell array is a 2T ROM-based array.

29. The method of claim 27 wherein said NVM 2T NAND cell array is a 2T Flash-based array.

30. The method of claim 27 wherein said NVM 2T NAND cell array is extended to a 2nT-cell NAND array for n-bit functions.

31. The method of claim 30 wherein said 2nT-cell NAND cell array is a 2nT-ROM-based array.

32. The method of claim 30 wherein said 2nT-cell NAND cell array is a 2nT-Flash-based array.

33. The NVM cell array of claim 2 wherein Vt0 is set about −2V with Phosphorous implant and Vt1 set about +0.7V as a virgin transistor without any implant dose.

* * * * *